US011611157B2

(12) United States Patent
Lee et al.

(10) Patent No.: US 11,611,157 B2
(45) Date of Patent: Mar. 21, 2023

(54) FLEXIBLE ELECTRICALLY CONDUCTIVE PASTES AND DEVICES MADE THEREWITH

(71) Applicant: DU PONT CHINA LIMITED, Wilmington, DE (US)

(72) Inventors: Hee Hyun Lee, Wilmington, DE (US); Edmund Francis Schieffer, Jr., Wilmington, DE (US); Hoang Vi Tran, Wilmington, DE (US)

(73) Assignee: Du Pont China Limited, Wilmington, DE (US)

(*) Notice: Subject to any disclaimer, the term of this patent is extended or adjusted under 35 U.S.C. 154(b) by 796 days.

(21) Appl. No.: 16/444,304

(22) Filed: Jun. 18, 2019

(65) Prior Publication Data

US 2019/0386403 A1    Dec. 19, 2019

Related U.S. Application Data

(60) Provisional application No. 62/686,343, filed on Jun. 18, 2018, provisional application No. 62/799,394, filed on Jan. 31, 2019.

(51) Int. Cl.
*H01L 21/461* (2006.01)
*H01R 4/04* (2006.01)
*H01R 43/00* (2006.01)
*H01R 13/03* (2006.01)

(52) U.S. Cl.
CPC .............. *H01R 4/04* (2013.01); *H01R 13/03* (2013.01); *H01R 43/007* (2013.01)

(58) Field of Classification Search
CPC ....... H01L 2924/01074; H01L 2924/14; H01L 2924/01013; H01L 2924/01029
See application file for complete search history.

(56) References Cited

U.S. PATENT DOCUMENTS

| 7,009,297 | B1 | 3/2006 | Chiang et al. |
| 7,745,516 | B2 | 6/2010 | Dueber et al. |
| 9,842,745 | B2* | 12/2017 | Mohammed .......... H01L 21/486 |
| 9,852,969 | B2* | 12/2017 | Uzoh ...................... H01L 24/17 |
| 9,911,718 | B2* | 3/2018 | Prabhu ................ H01L 23/5384 |
| 10,008,477 | B2* | 6/2018 | Haba ................... H01L 23/3171 |
| 2006/0017623 | A1 | 1/2006 | Luch |
| 2018/0163069 | A1 | 6/2018 | Wakita |

OTHER PUBLICATIONS

PCT International Search Report for Application No. PCT/US2019/37735; Blaine R. Copenheaver, Authorized Officer; ISA/US; dated Aug. 7, 2019.

* cited by examiner

*Primary Examiner* — Phuong Chi Thi Nguyen
(74) *Attorney, Agent, or Firm* — Dority & Manning, P.A.

(57) ABSTRACT

This invention provides a polymer thick film electrically conductive paste composition, comprising conductive metal powder, a resin blend of polyol and phenoxy resin, blocked aliphatic polyisocyanate and one or more polar, aprotic solvents. In one embodiment the paste composition is used to form electrically conductive adhesive. In another embodiment the paste composition is used to form an electrically conductive polymer thick film.

18 Claims, 3 Drawing Sheets

FLEXIBLE ELECTRICALLY CONDUCTIVE PASTES AND DEVICES MADE THEREWITH

CROSS-REFERENCE TO RELATED APPLICATIONS

This application claims benefit under 35 USC 119(e) of U.S. Provisional Application Ser. No. 62/686,343, filed Jun. 18, 2018, and U.S. Provisional Application Ser. No. 62/799,394, filed Jan. 31, 2019. Said applications are both incorporated herein for all purposes by reference thereto.

FIELD OF THE INVENTION

This invention relates to polymer thick film electrically conductive paste compositions for use as flexible electrically conductive adhesives and for forming stretchable electrical circuits on a substrate, and to devices and circuit assemblies made with such compositions.

BACKGROUND OF THE INVENTION

There is increasing need for stretchable electrical conductors and flexible electrically conductive adhesives (ECA). The trend in the In-Mold Electronic (IME) industry is to attach electrical components such as LED's to a conductive trace on a substrate before thermoforming. Epoxy thermoset-based ECA paste performs well for achieving strong adhesive force on the conductive trace. However, attached components often detach easily when flexed due to the limited level of flexibility of the highly cross-linked composition. Thermoplastic binder-based ECA paste is good to address the flexibility issue; however, the adhesive force typically does not meet that required.

Stretchable conductors are necessary for electrical circuits in wearable garments. Such conductors need to be stretchable and able to withstand washing and drying cycles.

There is a continuing need for improved stretchable electrical conductors and flexible electrically conductive adhesives (ECA).

SUMMARY OF THE INVENTION

This invention provides a polymer thick film electrically conductive paste composition, comprising:
(a) conductive metal powder;
(b) a resin blend of polyol and phenoxy resin both of which contain hydroxy groups (OH);
(c) blocked aliphatic polyisocyanate which contains isocyanate groups (NCO); and
(d) one or more polar, aprotic solvents, wherein the resin blend and the blocked aliphatic polyisocyante are dissolved in the one or more solvents and the metal powder is dispersed in the one or more solvents.

In one embodiment the ratio of the number of hydroxy groups of the resin blend to the number of isocyanate groups of the blocked aliphatic polyisocyanate, OH/NCO, is in the range from 8 to 25 and the ratio of the weight of the metal powder to the weight of the resin blend, Metal/Resin blend, is in the range from 4 to 7, and the polymer thick film electrically conductive paste composition is especially suitable for use as an ECA.

In another embodiment the ratio of the number of hydroxy groups of the resin blend to the number of isocyanate groups of the blocked aliphatic polyisocyanate, OH/NCO, is in the range from 1 to 10 and the ratio of the weight of the metal powder to the weight of the resin blend, Metal/Resin blend, is in the range from 7 to 10, and the polymer thick film electrically conductive paste composition is especially suitable for use in printing stretchable electrical conductors. Such conductors are useful in electrical circuits for wearables and other articles requiring stretchable conductors.

The invention also provides an electrical circuit assembly wherein one or more electrical circuit elements are attached on a substrate bearing conductive metal traces using the polymer thick film electrically conductive adhesive paste composition of the invention and articles containing stretchable electrical conductors formed from the polymer thick film electrically conductive paste composition of the invention.

In another aspect, the invention provides a method of attaching an electrical circuit element having a terminal to a substrate having first and second major surfaces and a conductive trace on the first surface, comprising the steps of:
(a) providing an injection mold composed of a plurality of mating portions that, when assembled, together define an interior cavity adapted to receive molten plastic material that is appointed to be formed onto the substrate;
(b) depositing an electrically conductive adhesive of any of claims 1 to 12 on at least one of the terminal or a connection point of the conductive trace that is appointed to be electrically connected to the terminal;
(c) assembling the injection mold with the substrate and the circuit element enclosed therein, with the circuit element being situated on the first surface with the terminal in registration with the connection point and in contact with the electrically conductive adhesive;
(d) thereafter filling the interior cavity with a molten plastic material; and
(e) solidifying the plastic material and thereafter removing the substrate and the circuit element attached thereto from the injection mold,
and wherein the cavity is configured such that, when solidified, the plastic material at least partially embeds the circuit element and secures it to the substrate with the terminal electrically connected to the conductive trace.

BRIEF DESCRIPTION OF THE DRAWINGS

The invention will be more fully understood and further advantages will become apparent when reference is made to the following detailed description of certain preferred embodiments of the invention and the accompanying drawings, wherein like reference numerals denote similar elements throughout the several views and in which.

DETAILED DESCRIPTION

Figure 1:
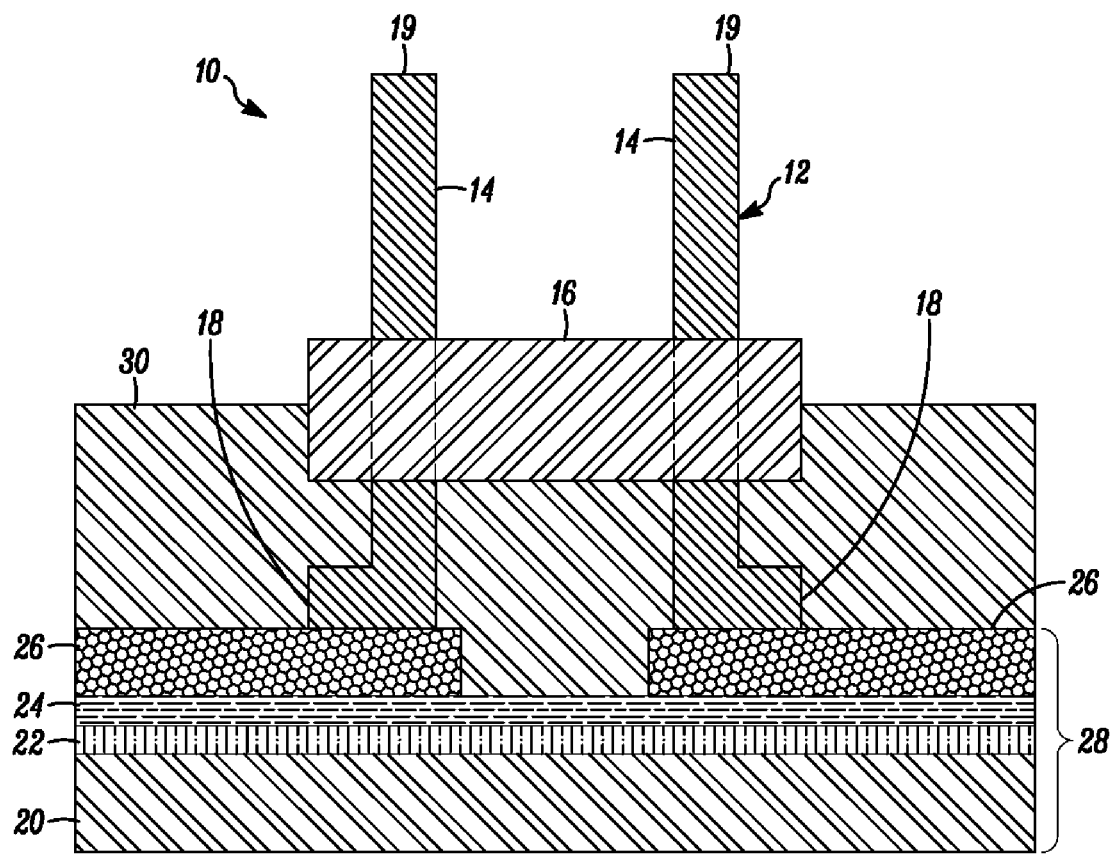
FIG. 1 depicts in schematic, cross-sectional view a portion of a circuit assembly of the prior art that includes an electrical connector assembly secured to a substrate.

The invention relates in an aspect to a polymer thick film electrically conductive paste composition.

In one embodiment this conductive paste composition is capable of adhering an electrical circuit element to a substrate and providing a satisfactory electrical connection between the circuit element and conductive traces on the substrate. This invention also relates to a device constructed with such a composition, and a method for fabricating such a device. The composition may be used in various applications, including ones wherein the base substrate is to be thermoformed or appointed to remain flexible during end use.

In another embodiment, the paste composition is used to form stretchable electrical conductors for articles such as wearable garments and seats. The invention also provides articles containing such conductors.

Describing the instant paste composition as "conductive" is done so meaning that the composition can be formed into a structure and thereafter processed to exhibit an electrical conductivity sufficient for conducting electrical current between devices and circuitry connected thereto or between components of a circuit. In many instances, a mechanical and electrical connection made with the present electrically conductive adhesive (ECA) can be an alternative to traditional soldering.

Various aspects of the present invention relate to the need for electrically conductive adhesives that are capable of bonding and connecting electrical components to a substrate with sufficient flexibility to be compatible with the production of in-mold electronic (IME) devices and circuit assemblies.

Generally stated, IME devices comprise a substrate (ordinarily a polymer) on which are mounted various semiconductor and other electronic components. Using an ECA, the components are secured to a substrate and electrically connected to metallic conductor traces formed on the substrate. In many cases, the substrate has an intricate, non-planar shape. For example, IME devices are widely used in automobile dashboards. It is especially desirable to be able to form the required shape by thermoforming processes carried out after the components have been attached to the substrate. However, this requires that the connections be strong and flexible to withstand the thermal and mechanical stresses of the forming process to yield a final assembly that is robust and reliable in operation. The mechanical integrity is equally valuable for the final assembly in its end use, in which it likely experiences stress, from temperature extremes, thermal cycling, vibration, and other mechanical forces. ECA formulations heretofore have generally not exhibited a combination of sufficiently good strength and flexibility to enable reliable manufacturing processes and exhibit robust properties for typical end uses.

In another aspect, the present ECA paste composition is employed in a process for constructing an electrical circuit assembly such as an IME device, wherein electrical circuit elements of any desired type are attached on a substrate bearing suitable conductive metal traces. The use of an ECA paste composition permits the circuit elements to be mechanically affixed to the substrate and concomitantly electrically connected to the conductive traces in a simple circuit assembly manufacturing operation that is readily automated. A mechanically strong attachment beneficially improves the reliability and yield of the manufacturing operation as well as the durability of the circuit assembly in its intended end uses.

Still another aspect of the disclosure provides an electrical circuit assembly, such as one constructed using the process just described. It also provides an electrical circuit assembly wherein electrical circuit elements are attached on a substrate bearing conductive metal traces using the paste composition of the invention. In an implementation, a circuit element attached to a substrate and connected using the present ECA composition is further secured by overmolding it with a suitable plastic material that at least partially embeds the circuit element. The overmolding can be carried out by any suitable method, including, without limitation, an injection molding technique.

As used herein, the term "electrical circuit element" refers, without limitation, to any of a variety of semiconductors, transistors, integrated circuits (ICs), discrete devices, light emitting diodes (LED), resistors, capacitors, inductors, transformers, antennas, mechanical or capacitive switches, relays, connectors, and other electrical, electronic, optoelectronic, and electromechanical components and assemblies known in the art. Each of these devices ordinarily has terminals through which they may be electrically connected to other circuitry. In an embodiment, the instant ECA paste composition is particularly suited to attaching and connecting devices known in the art as "surface mount" devices. Although the instant ECA paste composition may be used to attach devices that are manually placed on a substrate, it is beneficially employed to attach devices that are disposed on a substrate by "pick and place" or other like automated techniques. Alternatively, devices may be situated and attached as part of an overmolding process, as described in more detail hereinbelow.

Ideally, the ECA paste composition provides both a high bond strength for attaching a circuit element to a substrate and a low resistance connection between the element's terminals and conductive traces on the substrate. When providing an electrical conductor for a wearable garment the paste composition must result in a conductor that is stretchable and is able to withstand washing and drying cycles.

When the paste composition is used to form stretchable electrical conductor films for articles such as wearable garments and seats the electrically conductive film formed from the paste composition must adhere well to the substrate on which it has been deposited. When the article is a wearable garment the film must maintain its conductive properties despite being subjected to wash and dry cycles.

Electrically Conductive Adhesive (ECA) Composition

The instant polymer thick film electrically conductive adhesive paste composition comprises conductive metal powder, a resin blend of polyol and phenoxy resin, a blocked aliphatic polyisocyanate, and one or more polar, aprotic solvents, wherein the resin blend and the blocked aliphatic polyisocyanate are dissolved in the one or more solvents and the metal powder is dispersed in the one or more solvents.

The paste composition is named a polymer thick film paste composition because the polymer remains as a component during its intended end use as an electrically conductive adhesive or an electrically conductive film. The various constituents of the composition will be discussed in detail in the following sections.

Conductive Metal Powder

The conductive metal powder referred to herein is electrically conductive metal powder. Exemplary metals include without limitation silver, gold, copper, nickel, palladium, platinum, aluminum, and alloys and mixtures thereof. In some embodiments, the electrically conductive metal is selected from the group consisting of Ag, Cu, and Pd. In one embodiment, electrically conductive metal consists essentially of silver, which is beneficial for its processability and high conductivity. However, a composition including at least some non-precious metal may be used to reduce cost or to modify other properties. In still other embodiments, the metal powder may comprise core-shell particles, such as ones in which a silver shell of any thickness covers a core of another of the foregoing metals, such as copper. For simplicity, such powder particles may be called, for example, silver-coated copper powder. In yet other embodiments, silver powder may be mixed with silver chloride powder. The conductive metal powder used in embodiments of the present electrically conductive paste composition may be chosen independently of the resin blend, blocked polyisocyanate, and solvent described below, dependent only on the end-use application and the functional and manufacturing requirements associated therewith.

Conductive metal powder used in the present paste composition may be supplied as finely divided particles having any morphology, including without limitation, any one or more of the following morphologies: a flake form, a spherical form, a rod form, a granular form, a nodular form, a layered or coated form, or other irregular forms. Also contemplated are mixtures of particles of more than one of these types or mixtures of particles of the same type that have different size distributions. If more than one type of powder is used, for instance, if two types of silver powder are used, the silver powder with the smaller particle size is preferably incorporated first and the sample is the roll milled before the silver powder with the larger $d_{50}$ is added.

The particle size of the metal powder is not subject to any particular limitation, provided the required functional properties are attainable. As used herein, "particle size" is intended to refer to "median particle size" or $d_{50}$, by which is meant the 50% volume distribution size. The particle size distribution may also be characterized by other characteristics, such as $d_{90}$, meaning that 90% by volume of the particles are smaller than $d_{90}$, or $d_{10}$, meaning that 10% of the particles are smaller than $d_{10}$. Any of these volume distribution size characteristics may be determined by a number of methods understood by one of skill in the art, including but not limited to laser diffraction and dispersion methods employed by a Microtrac X100 particle size analyzer (Montgomeryville, Pa.). Laser light scattering, e.g., using a model LA-910 particle size analyzer available commercially from Horiba Instruments Inc. (Irvine, Calif.), may also be used. In various embodiments, the median size of the metal particles is greater than 0.2 μm and less than 10 μm, or greater than 0.5 μm and less than 10 μm, or greater than 1 μm and less than 10 μm, as measured using the Microtrac X100 analyzer.

In one embodiment, the electrically conductive metal powder comprises from about 55 wt % to about 80 wt % of the paste composition, based on the total weight of the paste composition. In further embodiments, the electrically conductive metal powder comprises from about 60 wt % to about 70 wt % of the paste composition. The amount of conductive powder must be sufficient to attain a desirable level of conductivity, but too high a powder loading may adversely affect the rheology of the composition or the ability to deposit it by a desired method.

The level of conductivity required depends on the intended end use of the composition and the amount of current that must be carried accordingly. For example, shielding and antistatic applications are associated with relatively modest currents, whereas larger currents are expected through device connections. Extended conductors with longer path lengths typically demand even higher conductivity, so that voltage drop is within acceptable limits and adequate noise immunity is maintained. In various embodiment, the present ECA in its finished state exhibits a sheet resistance within a range from a lower limit of 10, 25, 50, 75, or 100 mΩ/☐/25.4 μm (25.4 μm=1 mil) to an upper limit of 150, 200, or 250 mΩ/☐/25.4 μm. Formulations having a sheet resistance between 100 and 150 mΩ/☐/25.4 μm have been found useful for connecting electrical components to a circuit in a typical end use. For extended stretchable conductors, compositions having values of sheet resistance in the finished state below 50 mΩ/☐/25.4 μm are desirable.

Sheet resistance can be measured with known four-probe techniques for a deposited film. Alternatively, the resistance of a serpentine or meander pattern can be created and measured using a conventional ohmmeter; for example, films in accordance with the present disclosure have been characterized using a serpentine trace pattern that covers half an area 19 mm×16 mm, with the trace being approximately 10 μm thick and 1 mm wide throughout, and with its adjacent legs spaced 1 mm apart.

Resin Blend of Polyol and Phenoxy Resin

The resin blend is one of polyol and phenoxy (polyhydroxyether) resin.

Suitable polyol resins contain multiple hydroxy groups and react with isocyanates to form polyurethanes. Such resins include, without limitation, polyester diols. In an embodiment, the present ECA is formulated with a polyol resin, having a molecular weight ranging from 500 to 5000 g/mol.

In an embodiment, the present ECA composition is formulated with a phenoxy resin that includes secondary hydroxy groups and has a basic repeating form with the following structure:

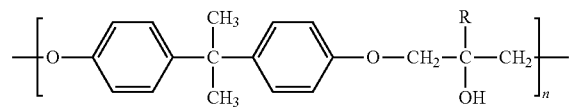

wherein R can be H or a lower alkane. In an embodiment, R=H, yielding the following basic repeating form:

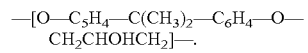

In various embodiments, the phenoxy resin may have an average molecular weight Mw of 25,000-70,000 Da, with 85-250 repeat units.

In one embodiment, the resin blend comprises from about 7 wt % to about 20 wt % of the paste composition, based on the total weight of the paste composition.

In one embodiment, the polyol comprises from about 1 wt % to about 5 wt % of the paste composition, based on the total weight of the paste composition and phenoxy resin comprises from about 6 wt % to about 15 wt % of the paste composition, based on the total weight of the paste composition.

Blocked Aliphatic Polyisocyanate

A blocked aliphatic polyisocyanate is an isocyanate reaction product that is stable at room temperature but dissociates to regenerate isocyanate functionality when heated. The resulting polyisocyanates can then react with active hydroxy-containing compounds in the resin blend. In an embodiment, the blocked aliphatic isocyanates used herein release their blocking agents at curing temperatures of typically 110-160° C.

Typical aliphatic polyisocyanates are hexamethylene diisocyanate (HDI) and isophorone diisocyanate (IPDI).

Typical blocking agents are 3,5-dimethylpyrazole (DMP), diethyl malonate (DEM), diisopropylamine (DIPA), 1,2,4-triazole (TRIA) and methyl ethyl ketone (MEK).

Typical blocked aliphatic polyisocyanates are DMP blocked HDI, (DEM)/(DIPA) blocked HDI and DEM blocked polyisocyanate using both HDI and IPDI.

In one embodiment, the blocked aliphatic polyisocyanate comprises from about 0.5 wt % to about 5 wt % of the paste composition, based on the total weight of the paste composition.

Solvents

One or more polar, aprotic solvents are present in the paste composition. The resin blend and the blocked aliphatic polyisocyante are dissolved in the one or more solvents and the metal powder is dispersed in the one or more solvents. A small amount of additional solvent may be added to the paste composition to adjust the final viscosity for dispensing or printing.

Typical solvents used include, without limitation, dipropylene glycol methyl ether, 2-butoxyethanol and triethyl phosphate.

In one embodiment, the solvents comprise from about 15 wt % to about 35 wt % of the paste composition, based on the total weight of the paste composition. The amount of solvent is typically adjusted to provide desirable rheology and other properties facilitating the desired deposition method.

Preparation of Polymer Thick Film Electrically Conductive Paste Composition

The resin blend is dispersed in a solvent and mixed to dissolve the resin blend. It can be heated, e.g., to 70° C., and stirred to dissolve the resin and form an organic medium. Portions of the resin blend can be dissolved in different solvents or in the same solvent to form additional organic media. Alternatively, a single organic medium can be used. The blocked aliphatic polyisocyanate is added to one of the organic mediums and mixed. The metal powder is added to one of the organic mediums and mixed. The metal powder is typically added incrementally with mixing after each addition to ensure better wetting. If more than one organic medium has been prepared, the media can be combined after any of the above steps and the resulting paste composition is milled. Solvent may be added to adjust the viscosity before dispensing or printing the paste composition.

Composition Used As An ECA

When the OH/NCO ratio is in the range from 8 to 25 and the ratio of the weight of the metal powder to the weight of the resin blend, Metal/Resin blend, is in the range from 4 to 7, the polymer thick film electrically conductive paste composition serves as an ECA. The ECA serves to attach electrical components to conductive traces on a substrate. For example, the ECA paste composition may be dispensed onto the conductive traces and electrical components, e.g., LEDs, thereafter placed on the dispensed ECA. The substrate is then heated, e.g., at 120-150° C. for 30-60 min, to evaporate the solvent from the ECA composition.

Composition Used to Form Stretchable Conductor

When the OH/NCO ratio is in the range from 1 to 10 and the ratio of the weight of the metal powder to the weight of the resin blend, Metal/Resin blend, is in the range from 7 to 10, the polymer thick film electrically conductive paste composition serves to form a stretchable electrical conductor on a substrate. For example, the foregoing paste composition may be printed onto a substrate in the desired pattern of the conductor. The substrate is then heated, e.g., at 120-140° C., to evaporate solvent from the paste composition.

Use of ECA to Attach Circuit Elements to Substrates

In another aspect of this disclosure, the present ECA composition is used to attach electrical and electronic devices to a substrate and connect them to conductive traces. Ideally, this attachment provides improved electrical and mechanical reliability.

FIG. 1 depicts generally at 10 a portion of a prior art circuit assembly constructed without use of an ECA composition. Connector assembly 12 is secured to a substrate 28, which has a user side situated at the bottom of the drawing and an opposing component side. A layer of graphic ink 22, which may carry printed indicia, and a base dielectric layer 24 are disposed on the component side of a base layer 20, along with conductive metal traces 26 fabricated in a predetermined pattern and occupying part of the component side of substrate 28. As used herein with respect to a circuit assembly, the term "substrate" refers collectively to base layer 20, along with any other layers present, such as the layers depicted in FIG. 1 and any other intervening or otherwise included functional or aesthetic layers. Substrate 28, including conductive traces 26, typically extends sidewardly beyond what is depicted in the figure.

Connector assembly 12 includes a plurality of connector pins 14, each having a connection pad 18 at one end that is configured as a terminal appointed to be electrically connected to an appointed connection point of conductive trace 26 of substrate 28. Pins 14 are ordinarily made of an electrically conductive metal, most commonly copper or a copper-containing alloy. Opposite ends 19 of pins 14 are configured to mate with a suitable female connector (not shown). In some embodiments, pins 14 are plated with a noble metal, such as silver or gold, to inhibit corrosion that might compromise the electrical connection with the mating connector. Pins 14 are conventionally arranged and secured by molding them in a connector header 16, which is often made of a phenolic or polyamide plastic.

For clarity of illustration, FIG. 1 shows only a portion of a larger circuit assembly, so that the disposition of connector assembly 12 is seen clearly. A typical circuit assembly includes additional electrical or electronic components of other types that are situated on substrate 28 outside of the portion depicted. The pattern of conductive traces 26 also extends further, and is used to connect the various additional components to each other and to the pins 14 of connector assembly 12 through connection pads 18, as needed for the intended functionality.

With continuing reference to FIG. 1, connector assembly 12 is mechanically secured to the substrate 28 by overmolding a layer 30 of polymeric material that secures connector assembly 12 on the component side of substrate 28. In the implementation shown, a portion of each pin above connector header 16, including end 19, protrudes through overmolding layer 30, permitting it to be connected to a complementary, mating connector or otherwise connected to external circuitry (not shown).

While conventional materials for the overmolding layer can provide a strong mechanical attachment of electrical or electronic components to the substrate, it has proven difficult to concomitantly ensure reliable and robust electrical connections in the finished device. In most end uses, the substrate and all its components are subject to temperature extremes, thermal cycling, and external vibration. Any of these can cause premature failure of the electrical connections.

Electrical problems can occur with components of any type, but have been found to be especially acute for multi-pin electrical connectors. For example, the FIG. 1 assembly might be used as an instrument panel for a motor vehicle that includes various conventional or touch pad switches and gages and indicator lights. Typically, these devices must electrically communicate with the engine and other vehicle systems, with the requisite electrical signals often coming through a multi-conductor wiring harness. For ease of manufacturing and servicing, the wiring harness ordinarily terminates in a connector configured to mate with a corresponding connector (such as connector assembly 12) on the instrument panel. The wiring harness connection is especially vulnerable, as flexure of the harness leverages stress onto the connector, and forces from external vibrations are coupled and localized at the mounting point. In addition, the connector may have to be large to provide the needed number of individual conductors and it must survive multiple connections and disconnections during a vehicle's service life. Unreliable connections between the wiring harness and the instrument panel lead to frustration, inconvenience, and potential safety hazards for the driver, as well as high manufacturing and repair costs for the vehicle supplier.

Although the electrical reliability of the connection could in principle be improved by directly soldering connections between components and the conductive metal traces 26, such a process is often impractical, for both cost and manufacturability. Materials often used for base layer 20 and others in substrate 28, such as polycarbonates and polyesters, cannot tolerate the required temperature for soldering. Many desired configurations feature a non-planar substrate structure, which is ordinarily produced by molding a planar workpiece into a requisite shape. The manufacture of such an article is facilitated by placing the components and making the required connections on an initially planar substrate, and only thereafter doing the required molding or other thermoforming process. However, this approach requires the attachment and connection processes to tolerate the temperature and mechanical stresses of forming. On the other hand, placement and soldering of devices after molding the substrate are much more difficult to accomplish using typical automated methods.

Alternatively, connections might be made using prior ECA materials. While ECA's based on thermosetting polymers, such as epoxies, might provide good mechanical strength and high conductivity, the connections typically are too rigid to tolerate needed molding processes or in-service vibration. ECA's based on silicones may not afford sufficient strength on their own, often have undesirably low electrical conductivity, and may require long cure cycles that are detrimental for manufacturing efficiency.

In some prior art applications, it has proven necessary to provide other external means to secure a mating connector or the like to connector 12 on substrate 28. For example, spring clips may be used to capture a mating connector or a threaded fastener extending through a bolt hole or engaging a tapped hole in substrate 28 (possibly in a molded boss) might be required.

However, it has been found that using the present ECA permits reliable connections to be made in a configuration modified from that of FIG. 1. As depicted generally at 40 in FIG. 2, a compliant, electrically conductive adhesive layer 42 is interposed between connection pads 18 and conductive metal traces 26 at connection points 27. It will be understood that the pattern of conductive metal traces normally extends across the substrate in lines of a required width, with connection points 27 optionally being somewhat enlarged to facilitate easy manufacture and reliable connection. The strength and flexibility afforded by the present ECA composition is believed to allow circuit assembly 40 to withstand thermal and mechanical stresses associated both with overmolding, and as encountered during end use. The improved structure is described and depicted in FIG. 2. For clarity of illustration, FIG. 2 again depicts a portion of the assembly that includes only a single component, but it is to be understood that additional electrical or electronic components, of any type and in any number, may be present elsewhere on substrate 28 and are connected using conductive traces 26. Most commonly, a plurality of components will be included. Any of these may be beneficially secured and connected in the same manner using the present ECA.

In the embodiment depicted, connector assembly 12 is further secured by overmolding layer 30. There are no particular limitations on the overmolding material, beyond compatibility with the components being secured and the substrate materials, including the conductive traces 26. Overmolding may be carried out individually for the various components, but for the sake of efficiency, the overmolding of all the relevant components may be beneficially effected in a single operation. Alternatively, some of the components in a given circuit assembly may be mounted by other known techniques.

FIG. 2 again depicts connector assembly 12 as being partially encased in overmolding material 30, but it will be recognized that connector header 16 might be fully embedded, as long as a sufficient length of pins 14 protrudes to allow reliable connection. Components of other types can be partially or fully embedded as well. Although FIG. 2 has been described presuming that all the components are on a single side of substrate 28, other embodiments in which components are mounted on both side of a substrate using the techniques described herein are also contemplated.

Figure 2:
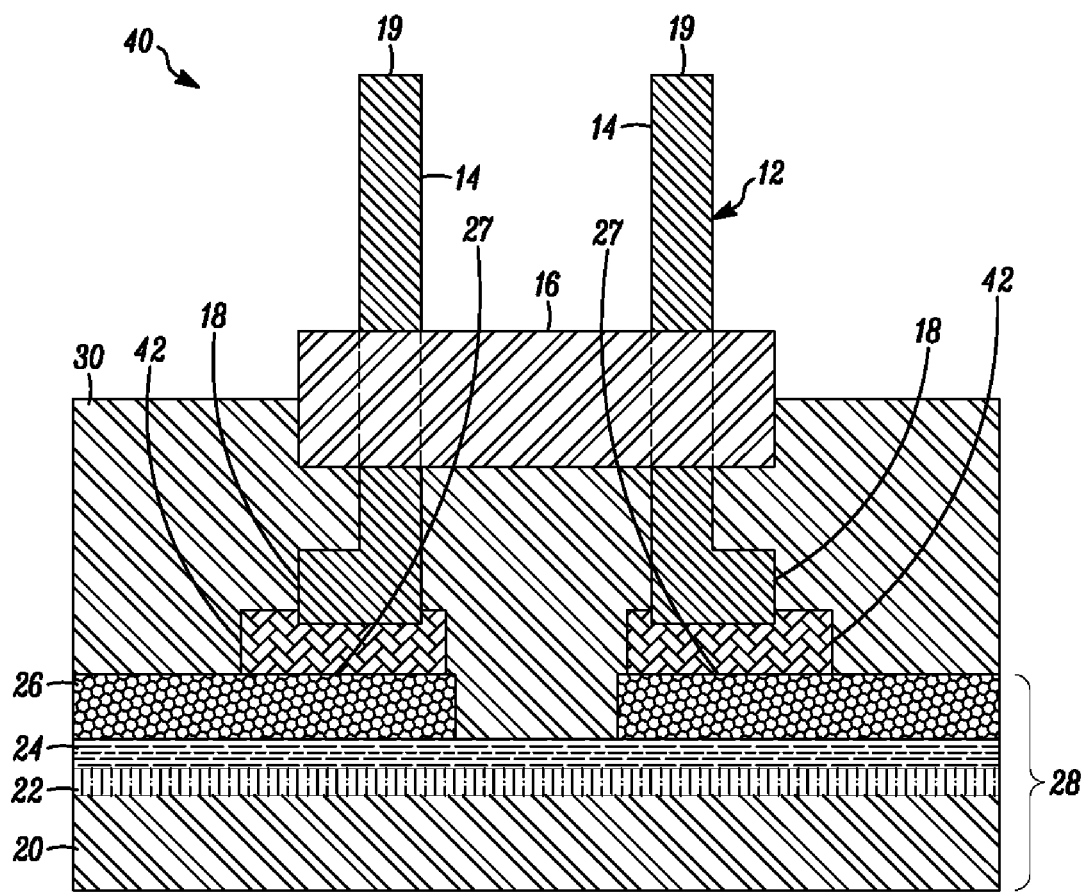
FIG. 2 depicts in schematic, cross-sectional view a portion of a circuit assembly in which an electrical connector assembly secured to a substrate using an electrically conductive adhesive of the present disclosure.

An aspect of the present disclosure provides a process for manufacturing a circuit assembly, such as that depicted at 40 in FIG. 2. Substrate 28 is fabricated, starting with a base layer 20, which is composed of any polymeric material having the requisite electrical and mechanical properties. For embodiments in which the circuit assembly is to be configured by thermal processing to provide a non-planar surface, a formable material is beneficially used, such as polyester or polycarbonate. However, base layer 20 in other embodiments can be composed of any compatible polymer-based material including, without limitation, acrylonitrile butadiene styrene (ABS), polymethyl methacrylate (PMMA), polyvinyl fluoride (PVF), polyamide, polyimide, or epoxy. The base layer material optionally contains filler materials for reinforcement or improving thermal behavior, such as particulate or fiber filler materials.

The present mounting technique using a compliant ECA is especially valuable for securing components to a substrate that may be flexible, thin, and possibly non-planar. However, other implementations in which the substrate is planar, too thick to exhibit significant flexibility, or otherwise rigid, are also contemplated as within the scope of the invention as herein presented. For example, rigid substrate materials, both organic and inorganic, are also possible, including, without limitation, metals such as aluminum and non-metals such as alumina.

Substrate 28 further comprises a pattern of conductive metal traces 26 configured to provide the required interconnections between the various components. Additional layers that provide functional or aesthetic properties may also be included in any operable order. As seen in FIG. 2, one or more layers including decoration or indicia printed using a graphic ink, such as layer 22, are disposed on base layer 20 by any convenient process. A dielectric layer 24 is typically provided atop any decorated or inked layer. The pattern of conductive metal traces 26 is formed atop dielectric layer 24. Although traces 26 are commonly formed by printing a conductive paste or ink, other processes, including without limitation photolithography, can also be used.

It will be recognized that additional functional or decorative layers may be included at any level within the stack that comprises overall substrate 28. For example, a conductive ground plane might be included to improve noise immunity or shielding. In an embodiment, such a ground plane might be provided by printing a layer of conductive ink between graphic ink layer 22 and dielectric layer 24 in the FIG. 2 configuration. In other implementations, the conductive traces might be provided in multiple layers, with intervening dielectric to allow crossovers, to accommodate more complicated circuit patterns that could not be configured otherwise. While layers such as dielectric 24 may encompass the entire area of base layer 20, in some implementations the coverage of any of the layers may be patterned and limited to certain areas as required for functionality or aesthetics. For example, it may be necessary to provide a barrier for the conductive traces, to prevent both electrical interaction and corrosion or other untoward degradation of chemical or mechanical properties.

In an embodiment, connector assembly 12 is attached to substrate 28 using an injection molding step involving injection mold tooling composed of a plurality of mating portions. When the portions are assembled, they form an interior cavity that accommodates substrate 28 and further defines a cavity into which molten plastic material is appointed to be injected. After the injected material hardens, it overmolds and at least partially embeds connector assembly 12 and secures it to substrate 28. This form of injection molding, in which a substrate is disposed within the mold and overmolding material is applied to one or both of its sides, is often termed "insert molding."

In an implementation, the injection mold tooling is composed of a first and a second mating portion. The first mating portion is configured with a recess or other comparable fixturing in which connector assembly 12 is temporarily received. The recess may include a series of small holes in a pattern that accommodates and engages the layout of pins 14. When the mating mold portions (including connector assembly 12 thus situated) are subsequently brought together around substrate 28, connector assembly 12 is positioned and secured so that each of its connection pads 18 is properly registered with a counterpart connection point 27, with intervening ECA 42 to effect the connection. In an embodiment, the recess is optionally configured such that assembly of the mating portions applies a slight force that is directed perpendicular the plane of substrate 28 and urges connection pads 18 into contact with ECA 42. In an implementation, it is beneficial if the force is sufficient to slightly deform the adhesive, as shown in FIG. 2, and promote good electrical contact. Then a suitable molten plastic is injected into the interior cavity of the mold, such that connector assembly 12 is at least partially embedded and secured in overmolding plastic 30 once it hardens. Thereafter, the mating portions of the mold are retracted, releasing connector assembly 12 from the first portion and permitting the completed circuit assembly 40 to be removed. The embedding of connector assembly 12 is sufficient to provide adequate attachment, while leaving enough of end 19 of each pin 14 protruding to allow it to be connected. In some embodiments, connector header 16 is fully encased by overmolding plastic 30 to enhance the attachment strength. The overmolding process provides the same beneficial mechanical and electrical attachment of components of other types. Component types that have no need for external connection may optionally be completely encased, affording an even more secure attachment. While overmolding 30 needs only to fully encompass the surface portion of substrate 28 bearing connector assembly 12 and other components being secured, it beneficially extends sufficiently to cover the entire pattern of conductive traces 26, and preferably covers all of substrate 28, to afford maximal protection and mechanical integrity.

Although the circuitry on the substrate might, in some instances, be self-contained and powered by an on-board battery or other source, more commonly the circuitry interacts with, or controls, other external devices. For example, the substrate might be configured as the control panel for an electrical appliance of any type, or as an instrument panel for a motor vehicle, to be mounted in the passenger compartment on the dashboard, console, door, or other appropriate location. Thus, the on-board circuitry must be connected to those devices, and usually a power source as well. Most commonly, this connection to external circuitry is made through a connector appointed to mate with connector assembly 12.

In some embodiments it is desirable for the user side of completed circuit assembly 40 to include indentations, protrusions, or other surface features. For example, a touch-sensitive capacitive switch might be located under a circular, square, or rectangular indentation, to help a user to locate the area to be touched by a finger. Such surface features could be formed in any suitable way, and at different points in the sequence of steps for manufacturing circuit assembly 40. In one option, the mold used for the foregoing injection molding might include a negative image of the desired features, so that an initially planar substrate could be thermally softened and deformed as desired at the same time as overmolding plastic 30 is formed. Alternatively, in the foregoing process, the substrate is thermoformed by hot pressing, vacuum forming, or the like after substrate 28 is prepared in planar form by situating layers such as ink layer 22, dielectric layer 24, and conductive traces 26 on base layer 20, but prior to overmolding plastic 30.

The deposition of ECA 42 can also be carried out in different ways, including, without limitation, brushing, spraying, ink jet printing, nozzle printing, stenciling, screen printing, or syringe deposition. It can be applied in the area appointed for connection, either directly at connection points 27 of conductive trace 26, or on a terminal of the component being connected to the trace, or both. The deposition can be done at any convenient stage of manufacture prior to placement of the component. In the process described above, ECA 42 is applied to conductive traces 26 just before the injection molding step.

In different embodiments, the requisite amount of ECA could be deposited on either or both of the component terminal or the portion of the conductive trace it will mate after the assembly. In general, using the present ECA provides a more robust connection than merely building up an extra amount of the conductive metal trace material in the region where contact is to be made, as the materials conventionally used for making conductive metal traces are substantially less compliant than the ECA. Because of its compliance, the present ECA is also superior in the FIG. 2 configuration to formulations that employ a thermosetting polymer such as an epoxy to provide adhesion. Although such materials bond strongly, their lower compliance does not well accommodate stresses during molding or end use, so they do not produce connections that are both strong and resilient.

The interposition of compliant ECA 42 is especially beneficial in mounting circuit elements that include multiple terminals, such as multi-pin forms of connector assembly 12. Manufacturing variability inevitably causes the bottom of connection pads 18 of different ones of respective pins 14 not to lie in a common geometrical plane; instead, the pins have slightly different lengths. Thus, when the connector assembly is urged downward into contact with conductive traces 26 in the prior-art configuration of FIG. 1, the longest pins come into contact first, and others of the pins may make imperfect, intermittent, or high resistance contact; some pins may even fail to reach their conductive traces at all. However, slight length differences can be accommodated by the compliance of ECA 42, both in the initial fabrication and during end use, leading to more robust mechanical and electrical performance.

The thicknesses of the various layers and components used in practicing aspects of the present invention are ordinarily not subject to any particular limitation. In an embodiment, the various layers of substrate 28 shown in FIG. 2 might have the following thicknesses: base layer 20 (0.2-1 mm); graphic ink 22 (1-2 μm); dielectric layer 24 (5-20 μm); conductive metal traces 26 (5-40 μm); and ECA layer 42 (20-70 μm). Although the drawing depicts two pins 14 of a connector assembly 12, it is to be understood that other configurations are also contemplated. For example, assemblies can have a single pin or a plurality of pins disposed in a circular arrangement, but more commonly they incorporate a plurality of pins arranged in equal spacing along a single line or along two or more parallel lines. Connector assemblies in which each of the lines includes 2 to 20 pins are very commonly used, but larger numbers may also be present. All these connector types are known and contemplated in the present process.

Examples, Comparative Experiments

The operation and effects of certain embodiments of the present invention may be more fully appreciated from a series of examples described below. The embodiments on which these examples are based are representative only, and the selection of those embodiments to illustrate aspects of the invention does not indicate that materials, components, reactants, conditions, techniques and/or configurations not described in the examples are not suitable for use herein, or that subject matter not described in the examples is excluded from the scope of the appended claims and equivalents thereof.

Examples 1-6, Comparative Experiments A-B

Preparation of ECA Paste Compositions

The ECA paste compositions of Examples 1-6 were prepared in the following manner.

Polymer medium 1 (PM-1)—Prepared by mixing 40 wt % blend of phenoxy resin and polyester polyol (PKHM-301, Gabriel, Akron, Ohio) with 60 wt % dipropylene glycol methyl ether (Dowanol™ DPM, Dow Chemical Co., Midland, Mich.). The manufacturer states that PKHM-301 is a melt blend of its solid-grade phenoxy PKHC resin and an oligomeric polyester polyol, the blend having a hydroxy content of 334 (OH equivalent weight, g/equiv.) and a molecular weight of 39,000 Da. The mixture of PKHM-301 and Dowanol™ DPM was heated and stirred at 70° C. for 12 hours and then stirred overnight at room temperature to dissolve all of the resin.

Polymer medium 2 (PM-2)—Prepared by mixing 19 wt % phenoxy resin (PKHH, Gabriel, Akron, Ohio) and 19 wt % blend of phenoxy resin and polyester polyol (PKHM-301, Gabriel, Akron, Ohio) with 62 wt % 2-butyoxyethanol (Butyl Cellosolve™, Dow Chemical Co. Midland, Mich.). The manufacturer of PKHH says it has a hydroxy content of 280 (OH equivalent weight, g/equiv.) and a molecular weight of 52,000 Da. This mixture was heated and stirred at 70° C. for 12 hours and then stirred overnight at room temperature to dissolve all of the resin.

Polymer medium 3 (PM-3)—Prepared by mixing 48.2 wt % (1 part by weight of phenoxy resin (PKHH Gabriel, Akron, Ohio) and 2 parts by weight of PKHM-301 blend (Gabriel, Akron, Ohio) with 51.8 wt % 2-butyoxyethanol (Butyl Cellosolve™, Dow Chemical Co. Midland, Mich.). This mixture was heated and stirred at 70° C. for 12 hours and then stirred overnight at room temperature to dissolve all of the resin.

The blocked aliphatic polyisocyanates (BAP) used were:

BAP-1—DMP blocked HDI (Desmodur® PL 350 MPA/SN, Covestro, Baytown, Tex.), Equivalent weight=approx. 400 (NCO equivalent weight, g/equiv.)

BAP-2—(DEM)/(DIPA) blocked HDI (Desmodur® BL 3370 MPA, Covestro, Baytown, Tex.), Equivalent weight=approx. 470 (NCO equivalent weight, g/equiv.)

BAP-3—DEM blocked polyisocyanate using both HDI and IPDI. (Desmodur® BL 3475 BA/SN, Covestro, Baytown, Tex.), Equivalent weight=approx. 510 (NCO equivalent weight, g/equiv.)

Silver powders used were:

Ag-A: silver powder, approximately spherical, with $d_{50}$~5.5 μm and $d_{90}$~13 μm Ag-B: silver powder, approximately spherical, with $d_{50}$~2.1 μm and $d_{90}$~5.6 μm Solvents used were:

S-1-2-butyoxyethanol (Butyl Cellosolve™, Dow Chemical Co. Midland, Mich.)

S-2—dipropylene glycol methyl ether (Dowanol™ DPM, Dow Chemical Co., Midland, Mich.)

S-3—triethyl phosphate (Eastman Chemical Co., Kingsport, Tenn.)

The blocked aliphatic polyisocyanate and additional solvent is added to the organic medium used in the Example followed by Thinky mixing at 1000 rpm for 30 sec. The silver powder is then added followed by Thinky mixing at 1000 rpm for 30 sec. The resulting sample was then subjected to several passes on a three roll mill to complete preparation of the ECA paste composition.

Each of the foregoing mixing steps might be carried out in a planetary, centrifugal mixer. For example, a Thinky® mixer (available from Thinky® USA, Inc., Laguna Hills, Calif.) operated at 1000 rpm for 30 s was suitable. After being well mixed, the paste composition was repeatedly passed through a three-roll mill with a 25 μm gap at pressures that were progressively increased from 0 to 150 psi (~1.04 MPa). A suitable mill is available from Charles Ross and Son, Hauppauge, N.Y. If more than one type of silver powder is to be used in the recipe, the silver with the smaller $d_{50}$ is preferably incorporated first. This sample is then roll milled before the silver powder(s) with larger $d_{50}$ is incorporated. After the second silver powder is added, the final paste composition is milled again with the same mill parameters.

The degree of dispersion of each paste composition may be measured using commercial fineness of grind (FOG) gages (e.g., gages available from Precision Gage and Tool, Dayton, Ohio) in accordance with ASTM Standard Test Method D 1210-05, which is promulgated by ASTM International, West Conshohocken, Pa., and is incorporated herein by reference. The resulting data are ordinarily expressed as FOG values represented as X/Y, meaning that the size of the largest particle detected is X μm and the median size is Y μm. In an embodiment, the FOG values of the present paste compositions are typically 20/10 or less, which typically has been found to be sufficient for good printability.

Ordinarily, the processed paste composition is adjusted prior to printing by adding a small amount of solvent as required to obtain a viscosity suitable for dispensing, stencil or screen printing. Viscosity values may be obtained using a Brookfield viscometer (Brookfield Inc., Middleboro, Mass.) with a #14 spindle and a #6 cup. Typically, a final viscosity of about 60~90 Pa·s (measured at 10 rpm/3 min) is found to yield good dispensing printing results and a final viscosity of 25-70 Pa·s (measured at 10 rpm/3 min) is found to yield good screen printing results, but some variation, for example ±30 Pa·s or more would be acceptable, depending on the precise printing apparatus and parameters.

The amounts in grams (g) of each of the components used in the Examples and Comparative Experiments and the OH/NCO ratios are shown in Table I.

TABLE I

| Sample | Polymer medium | Blocked Aliphatic Polyisocyanate | Solvent | Silver Powder | Ratio of OH/NCO | Ratio of Metal/Resin blend |
|---|---|---|---|---|---|---|
| Example 1 | 64.29 g of PM-3 | 3.21 g of BAP-1 | 11 g of S-1 | 150.01 g of Ag-A | 16.42 | 4.39 |
| Example 2 | 64.29 g of PM-3 | 3.21 g of BAP-2 | 11 g of S-1 | 150.01 g of Ag-A | 20.67 | 4.39 |
| Example 3 | 75.25 g of PM-1 | 3.75 g of BAP-1 | 10.35 g of S-2 | 161.25 g of Ag-A | 12.82 | 4.76 |
| Example 4 | 75.25 g of PM-1 | 3.75 g of BAP-2 | 10.75 g of S-2 | 161.2 g of Ag-A | 16.14 | 4.77 |
| Example 5 | 90.3 g of PM-1 | 4.5 g of BAP-1 | 15 g of S-2; 3 g of S-3 | 180 g of Ag-B | 12.82 | 4.43 |
| Example 6 | 117.92 g of PM-1 | 5.88 g of BAP-1 | 23.51 g of S-3 | 252.69 g Ag-A | 12.81 | 4.76 |
| Comp. Exp. A | 64.29 g of PM-3 | None | 14.5 g of S-2 | 150.0 g of Ag-A | No NCO | 4.84 |
| Comp. Exp. B | Henkel (Epoxy based ECA) | | XCE3104XL | | | |

Adhesive Characterization

The Adhesion performance of ECA paste compositions of Examples 1-6 and Comparative Experiments A-B was measured by the following procedure.

1. Each ECA paste composition was transferred into a 6 ml syringe for use with a Nordson EFD fluid dispensing system. The settings of the Nordson EFD were adjusted to obtain a consistent volume of dispensed material for each ECA.
2. The ECA paste compositions was dispensed onto the silver pads of a test coupon constructed with conductive silver traces. The silver pads were 0.050 inch (1.27 mm) wide to accommodate fixing 1206-package SMD LEDs to the pads using the ECA, for example the Memcon ML153N-RWT device. The traces on the test coupon were configured to allow voltage to be applied to the LEDs to verify LED operation.
3. LEDs were manually placed onto the dispensed ECA. A minimum of 30 LEDs comprised an adhesion test sample set.
4. The test coupon was placed in a Blue-M oven and the ECA was cured at 120° C. for 20 minutes.
5. To verify the integrity of the ECA bond, a voltage of 3 VDC was applied to each LED in order to light up the LED.
6. The test coupon was prepared for placement in a Dage 4000 shear tester. The Dage 4000 executes a wedge shear test in order to measure the force required to dislodge the LED from its connection to the test coupon. The Dage records the force required to release the LED in grams. The wedge-shear test was repeated for each LED on the test coupon. 30 repeats of the adhesion test constituted a complete adhesion test data set.

The average adhesions as thus measured are shown in Table II for the data set of 30 for each of the ECA paste compositions.

TABLE II

| Sample | Average adhesion |
|---|---|
| Example 1 | 1160 g |
| Example 2 | 1353 g |
| Example 3 | 1286 g |
| Example 4 | 1592 g |
| Example 5 | 977 g |
| Example 6 | 1038 g |
| Comp. Exp. A | 681 g |
| Comp. Exp. B | 2032 g |

Flexibility Characterization

The flexibility performance of the samples in Table III was measured as described below.

1. ECA formulations were transferred into a 6 ml syringe for use with a Nordson EFD fluid dispensing system.

The settings of the Nordson EFD were adjusted to obtain a consistent volume of dispensed material for each ECA.

2. ECA material was dispensed onto the silver pads of a test coupon constructed with conductive silver traces. The silver pads were 0.050 inch (1.27 mm) wide to accommodate fixing 1206-package SMD LEDs to the pads using the ECA, for example the Memcon ML153N-RWT device. The traces on the test coupon were configured to allow voltage to be applied to the LEDs to verify LED operation.

3. LEDs were manually placed onto the dispensed ECA. A minimum of 30 LEDs comprised a flexibility test sample set.

4. The test coupon was placed in a Blue-M oven and the ECA was cured at 120° C. for 20 minutes.

5. To verify the integrity of the ECA bond, a voltage of 3 VDC was applied to each LED in order to light up the LED.

6. One end of the test coupon was fixed by tape to a 1 inch (2.54 cm) diameter PVC pipe. Two flexibility tests were performed on each test coupon.

a. Flexibility Test 1—The test coupon was wrapped tightly around the outer diameter of the PVC pipe and then released. The wrap and release was repeated 10 times. A voltage of 3 VDC was applied to each LED to test whether it lights up and the result was recorded.

b. Flexibility Test 2—The test coupon was wrapped tightly around the outer diameter of the PVC pipe and the free end of the test coupon was fixed to the pipe using tape. The test coupon was set aside for 15 minutes. After 15 minutes and without releasing the test coupon, a voltage of 3 VDC was applied to each LED to test whether it lights up while in the flexed state and the result was recorded. After all LEDs were tested on the test coupon, it was detached from the pipe.

7. The flexibility tests were repeated with sufficient test coupons to obtain 30 repeats of the LED test.

The flexibility data as thus measured are set forth in Table III.

TABLE III

Flexibility Data (Flexibility Test 2, N = 30 per sample)

| Sample | Number of LED failures |
|---|---|
| Example 1 | 2 |
| Example 2 | 4 |
| Example 3 | 0 |
| Example 4 | 0 |
| Example 5 | 0 |
| Example 6 | 0 |
| Comp. Exp. A | 1 |
| Comp. Exp. B | 25 |

The adhesion data in Table II reveals that LEDs attached with the pastes of Examples 1-6 containing blocked polyisocyanate, phenoxy resin and flexible polyester polyol show desirably higher adhesive force than LEDs attached with Comparative Experiment A which does not contain blocked polyisocyanate in its composition. The Flexibility data in Table III shows that Examples 1-6 containing blocked polyisocyanate, phenoxy resin and flexible polyester polyol result in superior flexibility with few or no LED failures compared with Comparative Experiment B (Epoxy cured system) which had many LED failures.

Example 7, Comparative Experiment C

Fabrication of Test Panels with Overmolded Electrical Connector

For Example 7, a series of 25 circuit assemblies in the form of test panels was constructed. They included various types of circuitry and functions representative of what might be incorporated in an automobile instrument panel. The test panels were structured generally in a form like that depicted in FIG. 3. After fabrication, they were tested to demonstrate the efficacy of the present fabrication method and the present ECA composition used therein.

Figure 3:
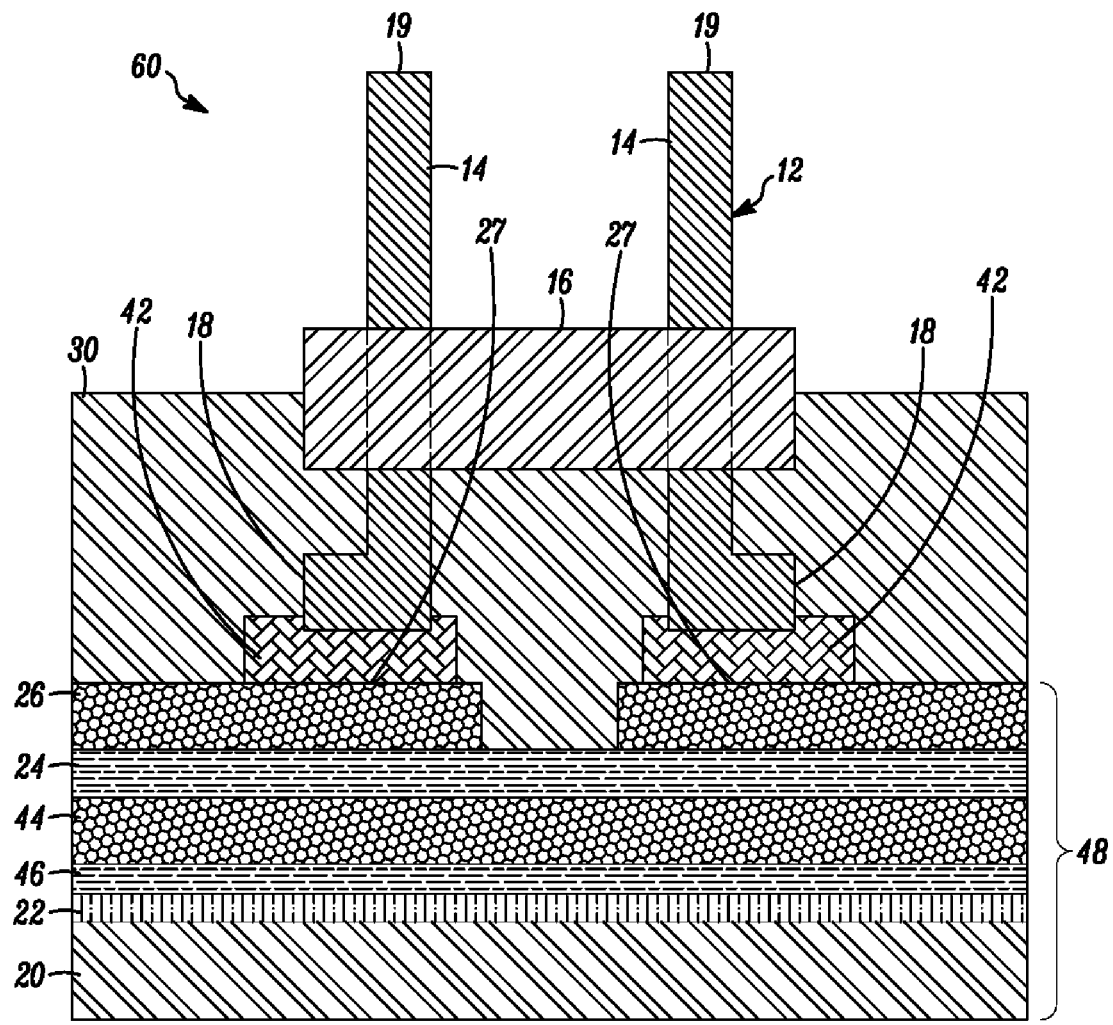
FIG. 3 depicts in schematic, cross-sectional view a portion of another circuit assembly in which an electrical connector assembly secured to a substrate using an electrically conductive adhesive of the present disclosure.

The structure 60 in FIG. 3 is a modified form of that shown at 40 in FIG. 2. In addition to the layers of substrate 28 of FIG. 2, substrate 48 in FIG. 3 further included an additional silver conductive layer 44 and a base dielectric layer 46 between crossover dielectric layer 24 and graphic ink layer 22. The substrates 48 were prepared using a base layer 20 of a plastic sheet approximately 16.5 cm square, on which were printed a 1-2 μm thick layer 22 of a conventional printable graphic ink composition providing user indicia, a base dielectric layer 46 and silver conductive layer 44 providing a ground plane. Then dielectric layer 24 of DuPont ME778 crossover dielectric paste (available commercially DuPont, Wilmington, Del.) was applied by screen printing and dried to a thickness of about 10 μm. Finally, a pattern of conductive traces was formed by screen printing DuPont ME602 or ME603 conductive silver-based paste (available commercially DuPont, Wilmington, Del.) atop the crossover dielectric layer 24. Panels were prepared using as the base layer either polycarbonate (PC) sheets that were 10, 15, or 20 mil (approximately 250, 375, or 500 μm) thick or 7.5 mil (approximately 200 μm) thick polyethylene terephthalate (PET) sheet. A suitable amount of a compliant ECA 42 having the composition of Example 6 above was stencil-printed using a 0.008 inch (200 μm) stencil on each of the conductor pads and then dried. Thereafter, a vacuum forming operation was used to prepare various surface indentations corresponding to ten capacitive-touch switches in various configurations included in the test panels. The test panels 60 were completed by an insert molding operation in which the various components were overmolded using Durastar™ DS1910HF polymer (available from Eastman Chemical Company, Kingsport, Tenn.).

For testing purposes, the traces were arranged to originate in an array of connector pads configured as connection points to be connected to a conventional surface-mount connector (Samtec TSM-110-01-T-DV) having 2 rows of 10 pins each on a 0.1 inch (2.54 mm) spacing. Traces led from these pins to various on-board circuit elements. Each board had two loopback traces of different lengths, with each trace connecting at its respective ends to a pair of the pins. Traces from other pins also led to 8 pairs of adjacent pads on which conventional surface-mount LED indicators were situated and connected.

Testing could be conducted either using a controller custom designed to exercise the various circuit functions or by using conventional laboratory test meters and power sources manually connected to the pins. Characterization of both the loopback traces and the LEDs allowed the efficacy of the electrical connection between the surface-mount connector and the conductive traces leading therefrom to be determined.

For the loopback traces, a good connection was inferred if the resistance measured using a conventional ohmmeter with probes applied to the appropriate pins was close to that predicted for the trace, based on the conductive ink used and its nominal dimensions (length, width, and height) as formed. A higher resistance was attributed to a poor connection between the pin terminal and the trace; too low a resistance likely resulted from a short through the intervening ground plane.

Each LED was tested both by applying a bias voltage directly onto the two connector pins nominally connected through the conductive traces to its device terminals and by using the controller. A proper connection was inferred for each LED if the device was illuminated if and only if it was energized in the expected manner and off if not energized. An LED that did not operate under any energization condition could indicate a failure at the connector, but could also occur if the conductive trace or the connection to the LED itself were faulty. Likewise, no conclusion regarding the connector itself could be drawn for LEDs that were either constantly on or could not be exercised by the controller in the expected manner. It was separately ascertained that no shorts were present between adjacent pins on the connector as a result of the forming operation.

Data from this testing of panels having connections made with the ECA composition of Example 6 above are set forth in Table IV. Also listed is the base layer material used for each panel (PC or PET) and its thickness. Results for the two loopback traces are indicated as "+" if both traces showed a resistance within expected limits. "Open(n)" indicated that "n" (n=1 or 2) traces were open-circuited, whereas "Short (n)" indicated a short circuit (i.e., a resistance much lower than expected) in "n" of the traces. The number of LEDs that operated properly is also shown.

TABLE IV

| Test Panel No. | Substrate | Substrate Thickness (μm) | Loopback | LEDs Operational |
|---|---|---|---|---|
| 1 | PC | 375 | + | 7 |
| 2 | PC | 375 | + | 8 |
| 3 | PC | 375 | + | 8 |
| 4 | PC | 375 | + | 8 |
| 5 | PC | 375 | + | 6 |
| 6 | PC | 375 | + | 6 |
| 7 | PC | 375 | + | 8 |
| 8 | PC | 375 | + | 8 |
| 9 | PC | 375 | + | 8 |
| 10 | PC | 375 | + | 7 |
| 11 | PC | 375 | + | 6 |
| 12 | PC | 375 | + | 8 |
| 13 | PC | 375 | + | 8 |
| 14 | PC | 375 | + | 8 |
| 15 | PC | 375 | + | 2 |
| 16 | PC | 375 | + | 8 |
| 17 | PC | 375 | + | 8 |
| 18 | PC | 375 | + | 7 |
| 19 | PC | 375 | + | 8 |
| 20 | PC | 375 | + | 8 |
| 21 | PC | 375 | + | 5 |
| 22 | PET | 190 | Open(2) | 0 |
| 23 | PET | 190 | + | 4 |
| 24 | PET | 190 | + | 6 |
| 25 | PET | 190 | + | 6 |

For Comparative Experiment B, another series of 15 test panels (not shown) were made using the same techniques described above, except that the compliant ECA was omitted. Thus, the connections between the conductive traces and the various LEDs and multipin connector relied solely on the physical contact established during the overmolding process.

TABLE V

| Comparative No. | Substrate | Substrate Thickness (μm) | Loopback | LEDs Operational |
|---|---|---|---|---|
| 1 | PC | 375 | Short(2) | 0 |
| 2 | PC | 375 | Short(1) | 3 |
| 3 | PC | 375 | Open(1) | 5 |
| 4 | PC | 375 | Short(2) | 0 |
| 5 | PC | 375 | Short(2) | 0 |
| 6 | PC | 500 | Short(2) | 0 |
| 7 | PC | 500 | Short(2) | 0 |
| 8 | PC | 250 | Short(2) | 0 |
| 9 | PC | 250 | Short(2) | 0 |
| 10 | PC | 250 | Open(2) | 0 |
| 11 | PC | 500 | Open(1) | 0 |
| 12 | PC | 375 | Open(2) | 0 |
| 13 | PC | 500 | + | 7 |
| 14 | PC | 500 | + | 4 |
| 15 | PC | 500 | + | 6 |

Comparison of the data shown in Tables IV and V demonstrates the efficacy of the compliant ECA in reliably making connections in test panels simulating a typical in-mold electronic circuit assembly.

Example 8

The test of Example 7 was repeated by fabricating and testing 39 additional test panels in the same configuration (FIG. 3). All the connections were made using the compliant ECA composition of Example 6. The same testing was conducted, yielding the results set forth in Table VI.

TABLE VI

| Test Panel No. | Substrate | Substrate Thickness (μm) | Loopback | LEDs Operational |
|---|---|---|---|---|
| 1 | PC | 375 | + | 8 |
| 2 | PC | 375 | + | 8 |
| 3 | PC | 375 | + | 3 |
| 4 | PC | 375 | + | 1 |
| 5 | PC | 500 | + | 8 |
| 6 | PC | 500 | Short(2) | 7 |
| 7 | PC | 500 | + | 2 |
| 8 | PC | 500 | + | 6 |
| 9 | PC | 500 | + | 0 |
| 10 | PC | 500 | + | 0 |
| 11 | PC | 250 | + | 7 |
| 12 | PC | 250 | + | 2 |
| 13 | PC | 250 | + | 6 |
| 14 | PC | 250 | + | 8 |
| 15 | PC | 375 | + | 8 |
| 16 | PC | 500 | + | 8 |
| 17 | PC | 500 | + | 6 |
| 18 | PC | 375 | + | 8 |
| 19 | PC | 500 | + | 8 |
| 20 | PC | 375 | + | 4 |
| 21 | PC | 375 | + | 7 |
| 22 | PC | 500 | Short(1) | 0 |
| 23 | PC | 375 | + | 7 |
| 24 | PC | 375 | + | 8 |
| 25 | PC | 500 | + | 8 |
| 26 | PC | 500 | + | 5 |
| 27 | PC | 500 | + | 8 |
| 28 | PC | 500 | + | 7 |
| 29 | PC | 500 | + | 8 |
| 30 | PC | 500 | + | 5 |
| 31 | PC | 250 | Short(2) | 8 |
| 32 | PC | 250 | Short(2) | 6 |

TABLE VI-continued

| Test Panel No. | Substrate | Substrate Thickness (μm) | Loopback | LEDs Operational |
|---|---|---|---|---|
| 33 | PC | 250 | + | 3 |
| 34 | PET | 190 | + | 5 |
| 35 | PET | 190 | + | 8 |
| 36 | PET | 190 | + | 8 |
| 37 | PET | 190 | + | 7 |
| 38 | PET | 190 | + | 8 |
| 39 | PET | 190 | + | 6 |

Example 9

The reliability of connections made using ECA as described above was tested by subjecting some of the test panels to long-duration environmental stress, at either 85° C. in lab air or 85° C. in moist air (85% relative humidity). The exposure duration ranged from 2448 to 3312 h (102 to 138 d). The resistance of the two loopback traces was measured using a laboratory multimeter at the start and after exposure, yielding the values listed in Table VII. Of the 14 traces on the 7 panels, 13 maintained a satisfactory resistance, while one of the traces on panel 7 opened during the exposure.

TABLE VII

Environmental Testing of Test Panels with ECA Connections

| Environmental Test Sample | Test Condition | Total Exposure (h) | Loopback Resistance ($\Omega$) | | | |
|---|---|---|---|---|---|---|
| | | | Start | | End | |
| | | | Trace 1 | Trace 2 | Trace 1 | Trace 2 |
| 1 | 85° C./85% RH | 3312 | 3 | 11.9 | 5.7 | 13.4 |
| 2 | 85° C./85% RH | 2448 | 2.3 | 8 | 2.7 | 6.2 |
| 3 | 85° C./85% RH | 2448 | 2.3 | 8.4 | 3.5 | 5 |
| 4 | 85° C. | 2760 | 3.6 | 13 | 3.5 | 12.2 |
| 5 | 85° C. | 2760 | 2.8 | 12.3 | 15 | 85 |
| 6 | 85° C. | 2448 | 1.9 | 6.5 | 2 | 6.2 |
| 7 | 85° C. | 2448 | 2 | 8.3 | 19.5 | open |

Having thus described the invention in rather full detail, it will be understood that this detail need not be strictly adhered to but that further changes and modifications may suggest themselves to one skilled in the art, all falling within the scope of the invention as defined by the subjoined claims.

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

It should be understood that in some instances herein, polymers (including ones prepared as microgels) are described by referring to the monomers or the amounts thereof used to produce the polymers. While such a description may not include the specific nomenclature used to describe the final polymer or may not contain product-by-process terminology, any such reference to monomers and amounts should be interpreted to mean that the polymer comprises those monomers (i.e. copolymerized units of those monomers) or that amount of the monomers, and the corresponding polymers and compositions thereof.

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In this specification, unless explicitly stated otherwise or indicated to the contrary by the context of usage, (a) amounts, sizes, ranges, formulations, parameters, and other quantities and characteristics recited herein, particularly when modified by the term "about", may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value; and (b) all numerical quantities of parts, percentage, or ratio are given as parts, percentage, or ratio by weight; the stated parts, percentage, or ratio by weight may or may not add up to 100.

What is claimed is:

1. A polymer thick film electrically conductive paste composition, comprising:
   (a) a conductive metal powder;
   (b) a resin blend of polyol and phenoxy resin both of which contain hydroxy groups (OH);
   (c) a blocked aliphatic polyisocyanate which contains isocyanate groups (NCO); and
   (d) one or more polar, aprotic solvents, wherein the resin blend and the blocked aliphatic polyisocyanate are dissolved in the one or more solvents and the metal powder is dispersed in the one or more solvents.

2. The paste composition of claim 1, wherein the conductive metal powder comprises silver powder.

3. The paste composition of claim 1, wherein the conductive metal powder comprises silver-coated copper powder.

4. The paste composition of claim 1, said paste composition comprising 55-80 weight percent of the conductive metal powder, 7-20 weight percent of the resin blend, 0.5-5 weight percent of the blocked aliphatic polyisocyanate and 15-35 weight percent of the one or more solvents, where the weight percentages are based on the total weight of the paste composition.

5. The paste composition of claim 1, comprising 8 to 25 equivalents of hydroxy groups in the resin blend for each single equivalent of isocyanate groups in the blocked aliphatic polyisocyanate, and further comprising 4 to 7 grams of the metal powder for each single gram of the resin blend.

6. The paste composition of claim 1, comprising 1 to 10 equivalents of hydroxy groups in the resin blend for each single equivalent of isocyanate groups in the blocked aliphatic polyisocyanate, and further comprising 7 to 10 grams of the metal powder for each single gram of the resin blend.

7. An article comprising:
an electrical circuit containing an electrically conductive entity formed from a polymer thick film electrically conductive paste composition comprising:
   (a) conductive metal powder;
   (b) resin blend of polyol and phenoxy resin, both of which contain hydroxy groups (OH);
   (c) blocked aliphatic polyisocyanate which contains isocyanate groups (NCO); and
   (d) one or more polar, aprotic solvents, wherein the resin blend and the blocked aliphatic polyisocyante are dissolved in the one or more solvents and the metal powder is dispersed in the one or more solvents,
and wherein said paste composition has been cured.

8. The article of claim 7, wherein the entity is an electrically conductive adhesive.

9. The article of claim 7, wherein the entity is an electrically conductive polymer thick film.

10. The article of claim 7, wherein the polymer thick film electrically conductive paste composition comprises 8 to 25 equivalents of hydroxy groups in the resin blend for each single equivalent of isocyanate groups in the blocked aliphatic polyisocyanate; and further comprises 4 to 7 grams of the metal powder for each single gram of the resin blend; and wherein the entity is an electrically conductive adhesive.

11. The article of claim 7, wherein the polymer thick film electrically conductive paste composition comprises 1 to 10 equivalents of hydroxy groups in the resin blend for each single equivalent of isocyanate groups in the blocked aliphatic polyisocyanate and further comprises 7 to 10 grams of the metal powder for each single gram of the resin blend; and wherein the entity is an electrically conductive polymer thick film.

12. The article of claim 11, wherein said article is a wearable garment.

13. A method of attaching an electrical circuit element having at least one terminal to a substrate having first and second major surfaces and a conductive trace on the first surface, comprising the steps of:
   (a) providing an injection mold composed of a plurality of mating portions that, when assembled, together define an interior cavity adapted to receive molten plastic material that is appointed to be formed onto the substrate;
   (b) depositing a compliant electrically conductive adhesive on at least one of the at least one terminal or a connection point of the conductive trace that is appointed to be electrically connected to the terminal;
   (c) assembling the injection mold with the substrate and the circuit element enclosed therein, with the circuit element being situated on the first surface with the at least one terminal being in registration with the connection point and in contact with the electrically conductive adhesive;
   (d) thereafter filling the interior cavity with a molten plastic material; and
   (e) solidifying the plastic material and thereafter removing the substrate
   and the circuit element attached thereto from the injection mold, and wherein the cavity is configured such that, when solidified, the plastic material at least partially embeds the circuit element and secures it to the substrate with the at least one terminal electrically connected to the conductive trace.

14. The method of claim 13, wherein the interior cavity is configured such that the circuit element is fully embedded in the solidified plastic material.

15. A circuit assembly comprising: (i) at least one electrical circuit element having at least one terminal and (ii) a substrate having first and second major surfaces and a conductive trace pattern on the first surface, wherein the at least one terminal and the conductive trace are electrically connected through an electrically conductive adhesive comprising a polymer thick film electrically conductive paste composition interposed therebetween; said paste composition comprising:
   (a) a conductive metal powder;
   (b) a resin blend of polyol and phenoxy resin both of which contain hydroxy groups (OH);
   (c) a blocked aliphatic polyisocyanate which contains isocyanate groups (NCO); and
   (d) one or more polar, aprotic solvents, wherein the resin blend and the blocked aliphatic polyisocyanate are dissolved in the one or more solvents and the metal powder is dispersed in the one or more solvents.

16. The circuit assembly of claim 15, wherein the electrical circuit element is attached to the substrate by an overmolded plastic in which the circuit element is at least partially embedded.

17. The circuit assembly of claim 16, wherein the circuit element is fully embedded in the overmolded plastic.

18. The circuit assembly of claim 17, wherein the circuit element is a connector assembly.

* * * * *